(12) United States Patent
Lin et al.

(10) Patent No.: US 6,319,846 B1
(45) Date of Patent: Nov. 20, 2001

(54) METHOD FOR REMOVING SOLDER BODIES FROM A SEMICONDUCTOR WAFER

(75) Inventors: Kuo-Wei Lin, Hsinchu; James Chen, Hsin-Chu; Eugene Chu, Hsinchu; Alex Fahn, Hsinchu; Chiou-Shian Peng, Hsinchu; Gilbert Fane, Jubei; Kenneth Lin, Hsinchu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/755,521

(22) Filed: Jan. 5, 2001

(51) Int. Cl.[7] ......................... H01L 21/302; H01L 21/461
(52) U.S. Cl. .................... 438/754; 438/745; 438/746; 438/747; 216/2; 216/13; 216/16
(58) Field of Search ......................... 438/754, 745, 438/746, 747; 216/2, 13, 16

(56) References Cited

U.S. PATENT DOCUMENTS

| | | | |
|---|---|---|---|
| 4,130,454 | * 12/1978 | Dutkewych et al. | 156/659 |
| 5,244,539 | * 9/1993 | McGrath et al. | 156/656 |
| 5,268,048 | * 12/1993 | Leibovitz et al. | 156/94 |
| 5,574,386 | * 11/1996 | Beaumont et al. | 324/765 |
| 6,134,776 | * 10/2000 | Hoffmeyer | 29/840 |

* cited by examiner

Primary Examiner—Charles Bowers
Assistant Examiner—David A. Zarneke
(74) Attorney, Agent, or Firm—Tung & Associates

(57) ABSTRACT

A method for removing a multiplicity of solder bodies connected to a semiconductor wafer through a copper wetting layer from the semiconductor wafer is disclosed. In the method, a semiconductor wafer that has on a top surface a multiplicity of solder bodies electrically connected to a multiplicity of bond pads through a multiplicity of copper wetting layers is first provided. When the multiplicity of solder bodies is found out of specification or must be removed for any other quality reasons, the semiconductor wafer is exposed to an etchant that has an etch rate toward the copper wetting layer at least 5 times the etch rate toward a metal that forms the multiplicity of bond pads. The semiconductor wafer may be removed from the etchant when the multiplicity of copper wetting layers is substantially dissolved such that the multiplicity of solder bodies is separated from the multiplicity of bond pads. The multiplicity of solder bodies may be either solder bumps or solder balls. The etchant may be a solution that contains $Ce(NH_4)_2(NO_3)_6$ in a concentration range between about 3 wt. % and about 30 wt. % in water. Ultrasonic vibration may further be used to facilitate the dissolution of the copper wetting layers in the etchant.

20 Claims, 2 Drawing Sheets

METHOD FOR REMOVING SOLDER BODIES FROM A SEMICONDUCTOR WAFER

FIELD OF THE INVENTION

The present invention generally relates to a method for removing solder bodies from a surface of a semiconductor wafer and more particularly, relates to a method for removing solder bumps or solder balls from an active surface of a semiconductor wafer by exposing a copper wetting layer in-between the solder bumps or solder balls and the wafer to an etchant that contains Ce $(NH_4)_2 (NO_3)_6$.

BACKGROUND OF THE INVENTION

In the fabrication of modern semiconductor devices, the ever increasing device density and decreasing device dimensions demand more stringent requirements in the packaging or interconnecting techniques in such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, thin film electrodeposition techniques require a ball limiting metallurgy layer to be deposited and defined by an etching process which has the same limitations as the C4 technique. For instance, a conventional thin film electrodeposition process for depositing solder bumps is shown in FIGS. 1A–1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UBM layer 26 improves bonding between a solder ball to be formed and the top surface 18 of the bond pad 14.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 μm and about 40 μm, preferably at a thickness of about 35 μm. The reason for the tight control on the thickness of the photoresist layer 34 is that, for achieving a fine-pitched solder bump formation, a photoresist layer of a reasonably small thickness must be used to achieve a high imaging resolution. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

A unique feature of the chip scale package is the use of an interposer layer that is formed of a flexible, compliant material. The interposer layer provides the capability of absorbing mechanical stresses during the package forming steps and furthermore, allows thermal expansion mismatch between the die and the substrate. The interposer layer, therefore, acts both as a stress buffer and as a thermal expansion buffer. Another unique feature of the chip scale package, i.e. such as a micro-BGA package, is its ability to be assembled to a circuit board by using conventional surface mount technology (SMT) processes.

The conventional flip chip bonding process requires multiple preparation steps for IC chips, i.e. the formation of aluminum bond pads on the chip, the under-bump-metallurgy process on the bond pads, the deposition of solder bumps and the reflow of the solder balls. When flip chip bumping is performed on a wafer scale and that the formation of the solder bumps or solder balls is out of specification, the whole wafer is frequently scrapped since there are no reliable methods for reworking the wafer. This can be very costly considering the cumulative costs for fabricating the multiplicity of IC devices on the wafer. The major difficulty in reworking the wafers has been the removal of solder bumps or solder balls that are on the wafer surface so that the bumping process can be repeated to produce bumps within specification.

It is therefore an object of the present invention to provide a method for reworking a bumped semiconductor wafer without scrapping the wafer when solder bumps or solder balls formed on the wafer are out of specification.

It is another object of the present invention to provide a method for reworking a bumped semiconductor wafer by removing the solder bumps or solder balls from the wafer surface such that a solder bumping process can be repeated on the wafer.

It is a further object of the present invention to provide a method for removing a multiplicity of solder bodies (of either solder bumps or solder balls) from an active surface of a semiconductor wafer by exposing the surface to an etchant that has a high etch rate for a copper seed layer placed under the solder bodies and a low etch rate for an aluminum bond pad or an organic passivation layer insulating the bond pad.

It is another further object of the present invention to provide a method for removing a multiplicity of solder bodies connected to a semiconductor wafer through a copper wetting layer from the wafer by dissolving the copper wetting layer by an etchant.

It is still another object of the present invention to provide a method for removing a multiplicity of solder bodies connected to a semiconductor wafer by a copper wetting layer from the wafer by exposing the copper wetting layer to an etchant that contains $Ce\,(NH_4)_2\,(NO_3)_6$.

It is yet another object of the present invention to provide a method for removing a multiplicity of solder bodies connected to a semiconductor wafer through a copper wetting layer from the wafer by exposing the copper wetting layer to an etchant containing between about 3 wt. % and about 30 wt. % of $Ce\,(NH_4)_2\,(NO_3)_6$.

It is still another further object of the present invention to provide a method for removing a multiplicity of solder bumps connected to a semiconductor wafer through a copper wetting layer from the wafer surface by exposing the copper wetting layer to an etchant containing $Ce\,(NH_4)_2\,(NO_3)_6$ and ultrasonic vibration to etch away the copper wetting layer.

It is yet another further object of the present invention to provide a method for removing a multiplicity of solder balls connected to a semiconductor wafer through a copper wetting layer from the wafer surface by exposing the multiplicity of copper wetting layer to an etchant that has an etch rate toward copper at least 5 times the etch rate toward aluminum.

SUMMARY OF THE INVENTION

In accordance with the present invention, a method for removing a multiplicity of solder bodies connected to a semiconductor wafer through a copper wetting layer from the wafer surface is provided.

In a preferred embodiment, a method for removing a multiplicity of solder bodies connected to a semiconductor wafer through a copper wetting layer from the wafer surface can be carried out by the operating steps of first providing a semiconductor wafer that has on a top surface a multiplicity of solder bodies electrically connected to a multiplicity of bond pads through a multiplicity of copper wetting layers therein-between; exposing the multiplicity of copper wetting layers on the semiconductor wafer to an etchant that has an etch rate toward copper at least 5 times that toward a metal for forming the multiplicity of bond pads; and removing the semiconductor wafer from the etchant when the multiplicity of copper wetting layers is substantially dissolved and that the multiplicity of solder bodies is separated from the multiplicity of bond pads.

The method for removing a multiplicity of solder bodies connected to a semiconductor wafer through a copper wetting layer may further include the step of subjecting the etchant to ultrasonic vibration to facilitate the dissolution of the multiplicity of copper wetting layers in the etchant. The method may further include the step of providing the multiplicity of solder bodies in a multiplicity of solder bumps, or the step of stencil printing a multiplicity of solder bumps on the semiconductor wafer forming the multiplicity of solder bodies, or the step of electroplating a multiplicity of solder bumps on the semiconductor wafer forming the multiplicity of solder bodies, or the step of reflowing a multiplicity of solder bumps into a multiplicity of solder balls forming the multiplicity of solder bodies.

The method for removing a multiplicity of solder bodies may further include the step of exposing the multiplicity of copper wetting layers to an etchant that preferably has an etch rate toward copper at least 10 times that toward a metal for forming the multiplicity of bond pads. The method may further include the step of forming the multiplicity of bond pads in aluminum insulated by a passivation layer of a polymeric material. The method may further include the step of exposing the multiplicity of copper wetting layers to an etchant including $Ce\,(NH_4)_2\,(NO_3)_6$, or the step of exposing the multiplicity of copper wetting layers to an etchant including between about 3 wt. % and about 30 wt. % $Ce\,(NH_4)_2\,(NO_3)_6$ in water, or the step of exposing the multiplicity of copper wetting layers to an etchant including $Ce\,(NH_4)_2\,(NO_3)_6$ and an acid selected from the group consisting of $HNO_3$ and $HCl$, or the step of exposing the multiplicity of copper wetting layers to an etchant containing $Ce\,(NH_4)_2\,(NO_3)_6$ maintained at a temperature between about 20° C. and about 60° C.

The present invention is further directed to a method for removing a multiplicity of solder bumps connected to a semiconductor wafer through a multiplicity of copper wetting layers from the wafer which can be carried out by the operating steps of first providing a semiconductor wafer that has on a top surface a Multiplicity of solder bumps electrically connected to a multiplicity of bond pads through a multiplicity of copper wetting layers therein-between;

exposing the multiplicity of copper wetting layers on the semiconductor wafer to an etchant including Ce $(NH_4)_2$ $(NO_3)_6$ and water; and removing the semiconductor wafer from the etchant when the multiplicity of copper wetting layers is substantially dissolved such that the multiplicity of solder bumps is separated from the multiplicity of bond pads.

The method for removing a multiplicity of solder bumps connected to a semiconductor wafer through a copper wetting layer from the wafer may further include the step of exposing the multiplicity of copper wetting layers to an etchant containing between about 3 wt. % and about 30 wt. % Ce $(NH_4)_2$ $(NO_3)_6$ in water, or the step of subjecting the etchant to ultrasonic vibration to facilitate the dissolution of the multiplicity of copper wetting layers in the etchant, or the step of maintaining the etchant at a temperature between about 20° C. and about 60° C.

The present invention is still further directed to a method for removing a multiplicity of solder balls connected to a semiconductor wafer through a multiplicity of copper wetting layers from the wafer which can be carried out by the steps of first providing a semiconductor wafer that has on a top surface a multiplicity of solder balls electrically connected to a multiplicity of bond pads through a multiplicity of copper wetting layers therein-between; exposing the multiplicity of copper wetting layers on the semiconductor wafer to an etchant that has an etch rate toward copper at least 5 times that toward a metal forming the multiplicity of bond pads; subjecting the etchant to ultrasonic vibration at a preselected frequency; and removing the semiconductor wafer from the etchant when the multiplicity of copper wetting layers is substantially dissolved such that the multiplicity of solder balls is separated from the multiplicity of bond pads.

The method for removing a multiplicity of solder balls connected to a semiconductor wafer through a multiplicity of copper wetting layers from the wafer may further include the step of providing an etchant that contains Ce $(NH_4)_2$ $(NO_3)_6$ and water, or the step of providing the multiplicity of bond pads in aluminum, or the step of providing the etchant in a solution containing between about 3 wt. % and about 30 wt. % Ce $(NH_4)_2$ $(NO_3)_6$ in water and an acid selected from the group consisting of $HNO_3$ and HCl.

BRIEF DESCRIPTION OF THE DRAWINGS

These and other objects, features and advantages of the present invention will become apparent from the following detailed description and the appended drawings in which:

FIGS. 2A–2B illustrate the present invention process for separating a solder bump from an aluminum bond pad with a copper wetting (or seeding) layer therein-between.

DETAILED DESCRIPTION OF THE PREFERRED EMBODIMENT

The present invention discloses a method for reworking a semiconductor wafer that has solder bumps or solder balls formed on top when the solder bumps or the solder balls are out of specification and must be removed.

The present invention novel method for removing the solder bumps or solder balls can be carried out by exposing a copper seed layer under the solder bumps or the solder balls to an etchant that contains Ce $(NH_4)_2$ $(NO_3)_6$ and optionally, assisted by an ultrasonic vibration transmitted by the etchant. Any other etchant that has a high selectivity toward the copper seed layer and a low selectivity toward the aluminum bond pad or the organic passivation layer insulating the bond pad may also be utilized.

In practicing the present invention novel method, an etchant that contains between about 3 wt. % and about 30 wt. % of Ce $(NH_4)_2$ $(NO_3)_6$ in water may be used to dissolve the copper wetting layer (or the copper seed layer) under the solder bumps or the solder balls. It should be noted that the present invention novel method may be used to remove solder bodies of either solder bumps or solder balls formed after a reflow process. The novel etchant solution may further contain between about 2 wt. % and about 10 wt. % of an acid such as $HNO_3$ or HCl.

The novel etchant that contains Ce $(NH_4)_2$ $(NO_3)_6$ is selected for its high etch rate toward the copper seed layer, and its low etch rate toward the aluminum bond pad and the organic passivation layer such as polyimide that insulates the bond pad. This is important so that the copper seed layer can be readily removed without significantly damaging any aluminum or polyimide. In practice, an etch rate ratio of at least 5:1, and preferably at least 10:1 should be maintained between the copper seed layer and the aluminum bond pad. Thus, the etching process can be suitably stopped as soon as the copper seeding layer is dissolved without damaging the bond pads.

Figure 1A:
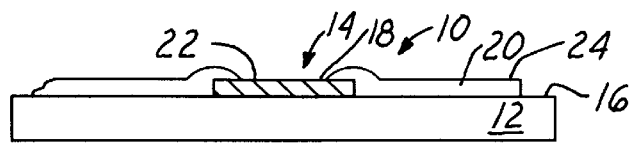
FIGS. 1A–1F illustrate processing steps for a conventional solder ball forming process for flip chip bonding.
Figure 1B:
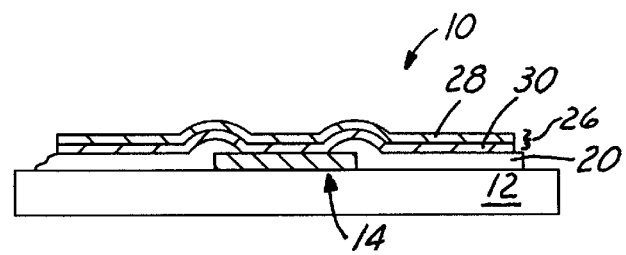
Figure 1C:
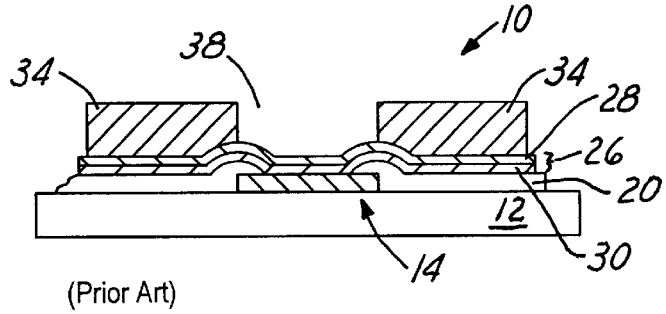
Figure 1D:
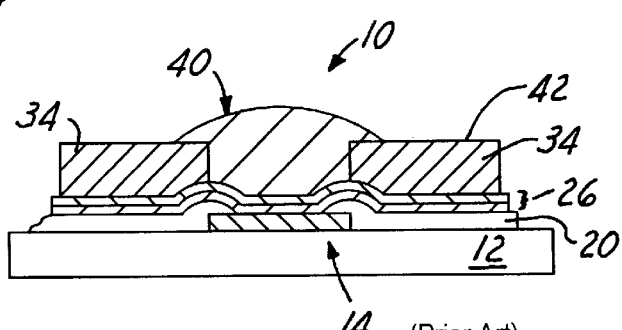
Figure 1E:
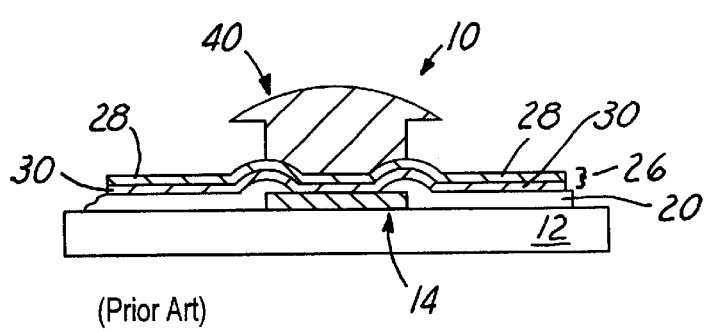
Figure 1F:
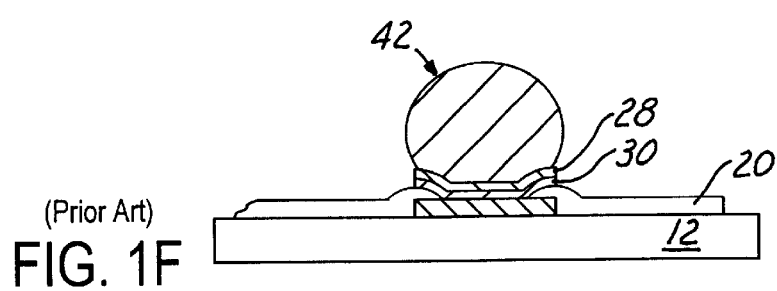
Figure 2A:
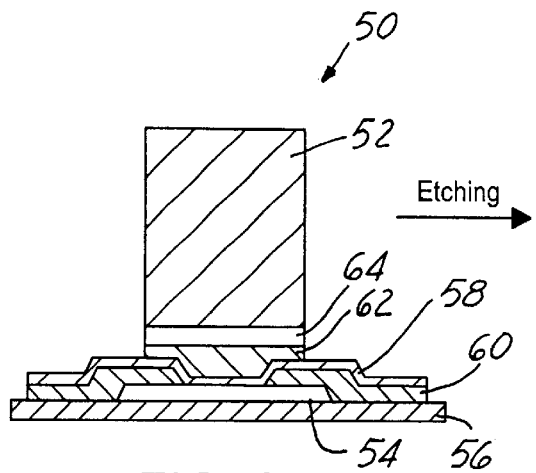
Figure 2B:
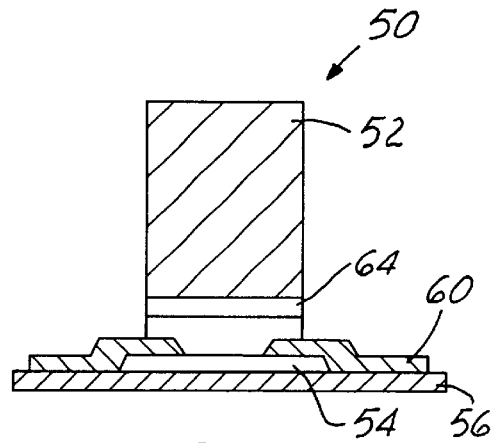

Referring now to FIGS. 2A and 2B, wherein a present invention solder bump structure 50 is shown. The solder bump structure 50 is formed by a solder bump 52 connected to an aluminum bond pad 54 situated on a pre-processed semiconductor substrate 56. In the solder bump structure 50 shown in FIG. 2A, a UBM (under-bump-metallurgy) layer 58 is first sputter deposited on top of the aluminum bond pad 54 and the passivation layer 60. The passivation layer 60 is used to electrically insulate the aluminum bond pad 54 and can be formed of any suitable insulating or dielectric material such as silicon oxide, silicon nitride or an organic passivation material such as polyimide. To successfully practice the present invention method, the etchant selected must not only have a low etch rate toward the aluminum bond pad 54, but also a low rate toward the passivation layer 60. For instance, when the passivation layer 60 is formed of polyimide, the etchant must not have a high etch rate for the polyimide material.

The UBM layer 58 may be suitably formed of a material such as Ti, TiN or Cr for its desirable barrier property. On top of the UBM layer 58, is deposited a copper seed layer 62 and a nickel barrier layer 64. A suitable thickness for the copper seed layer (or the wetting layer) may be between about 4 $\mu$m and about 6 $\mu$m, while a suitable thickness for the nickel layer 64 may be between about 2 $\mu$m and about 4 $\mu$m. The solder bump 52 can be deposited by either a stencil printing technique or a screen printing technique.

To remove the solder bump 52 from the solder bump structure 50, the structure is exposed to an etchant that contains Ce $(NH_4)_2$ $(NO_3)_6$ and water. A suitable concentration of Ce $(NH_4)_2$ $(NO_3)_6$ in water may be between about 3 wt. % and about 30 wt. %. The word "about" used in this writing indicates a range of values that is ±10% of the average value given. The water-based etchant solution may further includes an acid such as $HNO_3$ or HCl in a concentration range of between about 2 wt. % and about 10 wt. %. The acid content in the etchant may be optional and may not be necessary under certain processing conditions. The etchant solution may be kept at a temperature between about 20° C. and about 60° C.

The etchant solution may optionally be subjected to ultrasonic vibration, for instance, when placed in a Megasonic® apparatus to further assist the lift-off of the solder bumps. After the solder bumps are lifted-off the wafer surface, the wafer may be dried and be ready for a second solder bumping process.

Figure 3A:
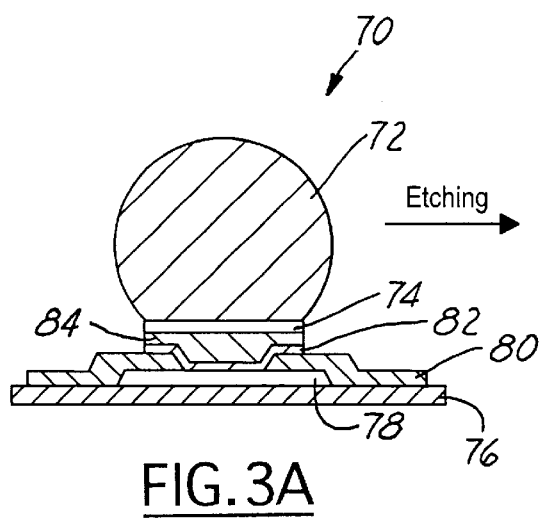
FIGS. 3A–3B illustrate the present invention method for separating a solder ball from an aluminum bond pad by dissolving a copper seed layer therein-between by using an etchant of the present invention.
Figure 3B:
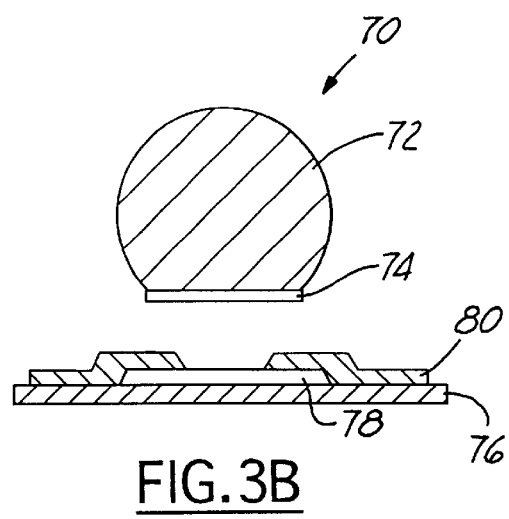

The present invention novel method may further be utilized to lift-off solder balls, when the solder bumps have been reflown into solder balls. This is shown in FIGS. 3A and 3B. It is seen that in the solder ball structure 70, the solder ball 72 is connected to an aluminum bond pad 78 situated on a pre-processed semiconductor substrate 76. In-between the solder ball 72 and the bond pad 78, are the passivation layer 80, the UBM layer 82, the copper seed layer 84 and the nickel barrier layer 74. The solder ball 72 is formed from a solder bump that generally contains lead and tin and reflown at a reflow temperature that is at least the melting temperature of the lead/tin material.

When the solder balls 72 formed on the pre-processed semiconductor substrate 76 are determined to be out of specification, the solder ball structure 70 may be processed in a wet bench by using an etchant that contains Ce $(NH_4)_2$ $(NO_3)_6$ for removing the solder balls 72 by dissolving the copper seed layer 84. The method for solder balls 72 removal is similar to that described previously for removing the solder bumps 52. This is also shown in FIG. 3B.

The present invention novel method for removing a multiplicity of solder bodies connected to a semiconductor wafer through a copper wetting layer from the wafer has therefore been amply described in the above description and in the appended drawings of FIGS. 2A–3B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for removing a multiplicity of solder bodies connected to a semiconductor wafer through a copper wetting layer from said wafer comprising the steps of:
   providing a semiconductor wafer having on a top surface a multiplicity of solder bodies electrically connected to a multiplicity of bond pads through a multiplicity of copper wetting layers therein between;
   exposing said multiplicity of copper wetting layers on said semiconductor wafer to an etchant having an etch rate toward copper at least 5 times that toward a metal forming said multiplicity of bond pads; and
   removing said semiconductor wafer from said etchant when said multiplicity of copper wetting layers is substantially dissolved such that said multiplicity of solder bodies separates from said multiplicity of bond pads.

2. A method for removing a multiplicity of solder bodies connected to a semiconductor wafer through a copper wetting layer from said wafer according to claim 1 further comprising the step of subjecting said etchant to ultrasonic vibration to facilitate the dissolution of said multiplicity of copper wetting layers.

3. A method for removing a multiplicity of solder bodies connected to a semiconductor wafer through a copper wetting layer from said wafer according to claim 1 further comprising the step of providing said multiplicity of solder bodies in a multiplicity of solder bumps.

4. A method for removing a multiplicity of solder bodies connected to a semiconductor wafer through a copper wetting layer from said wafer according to claim 1 further comprising the step of stencil printing a multiplicity of solder bumps on said semiconductor wafer forming said multiplicity of solder bodies.

5. A method for removing a multiplicity of solder bodies connected to a semiconductor wafer through a copper wetting layer from said wafer according to claim 1 further comprising the step of electroplating a multiplicity of solder bumps on said semiconductor wafer forming said multiplicity of solder bodies.

6. A method for removing a multiplicity of solder bodies connected to a semiconductor wafer through a copper wetting layer from said wafer according to claim 1 further comprising the step of reflowing a multiplicity of solder bumps into a multiplicity of solder balls forming said multiplicity of solder bodies.

7. A method for removing a multiplicity of solder bodies connected to a semiconductor wafer through a copper wetting layer from said wafer according to claim 1 further comprising the step of exposing said multiplicity of copper wetting layers to an etchant preferably having an etch rate toward copper at least 10 times that toward a metal forming said multiplicity of bond pads.

8. A method for removing a multiplicity of solder bodies connected to a semiconductor wafer through a copper wetting layer from said wafer according to claim 1 further comprising the step of forming said multiplicity of bond pads in Al insulated by a passivation layer of a polymeric material.

9. A method for removing a multiplicity of solder bodies connected to a semiconductor wafer through a copper wetting layer from said wafer according to claim 1 further comprising the step of exposing said multiplicity of copper wetting layers to an etchant comprising Ce $(NH_4)_2$ $(NO_3)_6$.

10. A method for removing a multiplicity of solder bodies connected to a semiconductor wafer through a copper wetting layer from said wafer according to claim 1 further comprising the step of exposing said multiplicity of copper wetting layers to an etchant comprising between about 3 wt. % and about 30 wt. % Ce $(NH_4)_2$ $(NO_3)_6$ in water.

11. A method for removing a multiplicity of solder bodies connected to a semiconductor wafer through a copper wetting layer from said wafer according to claim 1 further comprising the step of exposing said multiplicity of copper wetting layers to an etchant comprising Ce $(NH_4)_2$ $(NO_3)_6$ and an acid selected from the group consisting of $HNO_3$ and HCl.

12. A method for removing a multiplicity of solder bodies connected to a semiconductor wafer through a copper wetting layer from said wafer according to claim 1 further comprising the step of exposing said multiplicity of copper wetting layers to an etchant comprising Ce $(NH_4)_2$ $(NO_3)_6$ maintained at a temperature between about 20° C. and about 60° C.

13. A method for removing a multiplicity of solder bumps connected to a semiconductor wafer through a copper wetting layer from said wafer comprising the steps of:
   providing a semiconductor wafer having on a top surface a multiplicity of solder bumps electrically connected to a multiplicity of bond pads through a multiplicity of copper wetting layers therein between;

exposing said multiplicity of copper wetting layers on said semiconductor wafer to an etchant comprising Ce $(NH_4)_2 (NO_3)_6$ and water; and removing said semiconductor wafer from said etchant when said multiplicity of copper wetting layers is substantially dissolved such that said multiplicity of solder bumps separates from said multiplicity of bond pads.

14. A method for removing a multiplicity of solder bumps connected to a semiconductor wafer through a copper wetting layer from said wafer according to claim 13 further comprising the step of exposing said multiplicity of copper wetting layers to an etchant comprising between about 3 wt. % and about 30 wt. % Ce $(NH_4)_2 (NO_3)_6$ in water.

15. A method for removing a multiplicity of solder bumps connected to a semiconductor wafer through a copper wetting layer from said wafer according to claim 13 further comprising the step of subjecting said etchant to ultrasonic vibration to facilitate the dissolution of said multiplicity of copper wetting layers in said etchant.

16. A method for removing a multiplicity of solder bumps connected to a semiconductor wafer through a copper wetting layer from said wafer according to claim 13 further comprising the step of maintaining said etchant at a temperature between about 20° C. and about 60° C.

17. A method for removing a multiplicity of solder balls connected to a semiconductor wafer through a copper wetting layer from said wafer comprising the steps of:

providing a semiconductor wafer having on a top surface a multiplicity of solder balls electrically connected to a multiplicity of bond pads through a multiplicity of copper wetting layers therein between;

exposing said multiplicity of copper wetting layers on said semiconductor wafer to an etchant having an etch rate toward copper at least 5 times that toward a metal forming said multiplicity of bond pads;

subjecting said etchant to ultrasonic vibration at a preselected frequency; and removing said semiconductor wafer from said etchant when said multiplicity of copper wetting layers is substantially dissolved such that said multiplicity of solder balls separates from said multiplicity of bond pads.

18. A method for removing a multiplicity of solder balls connected to a semiconductor wafer through a multiplicity of copper wetting layers from said wafer according to claim 17 further comprising the step of providing said etchant comprising Ce $(NH_4)_2 (NO_3)_6$ and water.

19. A method for removing a multiplicity of solder balls connected to a semiconductor wafer through a multiplicity of copper wetting layers from said wafer according to claim 17 further comprising the step of providing said multiplicity of bond pads in aluminum.

20. A method for removing a multiplicity of solder balls connected to a semiconductor wafer through a multiplicity of copper wetting layers from said wafer according to claim 17 further comprising the step of providing said etchant in a solution containing between about 3 wt. % and about 30 wt. % Ce $(NH_4)_2 (NO_3)_6$, water and an acid selected from the group consisting of $HNO_3$ and HCl.

* * * * *